United States Patent
Andrews et al.

[11] Patent Number: 6,028,447
[45] Date of Patent: Feb. 22, 2000

[54] FPGA HAVING PREDICTABLE OPEN-DRAIN DRIVE MODE

[75] Inventors: William B. Andrews, Long Pond; James F. Hoff, Bethlehem; Satwant Singh, Macungie, all of Pa.

[73] Assignee: Lucent Technologies Inc., Murray Hill, N.J.

[21] Appl. No.: 08/899,428

[22] Filed: Jul. 24, 1997

[51] Int. Cl.[7] .................. H03K 19/177; H01L 25/00; G06F 7/38

[52] U.S. Cl. .................. 326/41; 326/39; 326/44; 326/37

[58] Field of Search .................. 326/41, 40, 39, 326/37, 44, 56

[56] References Cited

U.S. PATENT DOCUMENTS

| | | |
|---|---|---|
| 5,144,166 | 9/1992 | Camarota et al. .................. 326/41 |
| 5,233,539 | 8/1993 | Agrawal et al. .................. 364/489 |
| 5,311,080 | 5/1994 | Britton et al. . |
| 5,329,180 | 7/1994 | Popli et al. .................. 326/39 |
| 5,329,460 | 7/1994 | Agrawal et al. .................. 364/489 |
| 5,671,432 | 9/1997 | Bertolet et al. .................. 395/800 |

*Primary Examiner*—Michael Tokar
*Assistant Examiner*—Daniel D. Chang

[57] ABSTRACT

A field-programmable gate array (FPGA) having at least one programmable cell (e.g., an input/output (I/O) cell) having an output node circuit (e.g., a pad circuit) in which the output data signal and the tri-state signal are applied to a multiplexer that drives the tri-state port of an output buffer in the output node circuit. This configuration enables the output node circuit to be configured for open drain drive mode operations in a fast, predictable manner that does not need to rely on the FPGA's general routing resources.

12 Claims, 2 Drawing Sheets

FPGA HAVING PREDICTABLE OPEN-DRAIN DRIVE MODE

BACKGROUND OF THE INVENTION

1. Field of the Invention

The present invention relates to computer processor hardware, and, in particular, to field-programmable gate arrays.

2. Description of the Related Art

A field-programmable gate array (FPGA) is an integrated circuit that enables the user to program the functionality to be implemented by the FPGA.

FIG. 1 shows a schematic diagram of a typical FPGA 100. FPGA 100 comprises an array 102 of programmable logic cells (i.e., the logic array), surrounded by a "ring" 104 of programmable input/output (I/O) cells, surrounded by a ring 106 of output nodes (also referred to as "pads"). The I/O cells provide the signal processing interface between the outside world (i.e., exterior to FPGA 100) and the array of logic cells, where the programmed functionality of the FPGA is implemented. The pads are locations where individual physical connections (e.g., wire bonds) are made to transmit data to and from FPGA 100. For each pad, there is a pad circuit within an I/O cell that handles the I/O signal processing for that pad. (For purposes of this specification, pad circuitry refers to "output node circuitry" used to perform I/O signal processing for the output node (i.e., the pad) of an FPGA I/O cell. Those skilled in the art will understand that a logic cell within the FPGA logic array may also have an output node circuit that performs I/O signal processing for an output node of that FPGA logic cell, where that output node connects the logic cell to circuitry external to the logic cell (e.g., I/O cells, other logic cells).)

FIG. 2 shows a simplified block diagram of a typical pad circuit 200 for an I/O cell of FPGA 100 of FIG. 1. Pad circuit 200 comprises an output buffer 202 and an input buffer 204 and handles I/O signal processing between the logic array of FPGA 100 and that portion of the outside world connected to one of the pads of FPGA 100. Output buffer 202 receives output data from the logic array of FPGA 100 for transmission to the pad, and input buffer 204 receives input data presented at the pad from the outside world for transmission to the logic array.

The tri-state signal, presented at a tri-state port of output buffer 202, is a control signal that configures pad circuit 200 for either data input or data output processing. When the tri-state signal is low (i.e., logic 0), pad circuit 200 is configured for data output processing, where the value of the output data signal received at the data-in port of output buffer 202 is presented at the pad. When the tri-state signal is high (i.e., logic 1), pad circuit 200 is configured for data input processing, where the value of the signal presented at the pad is transmitted by input buffer 204 to the logic array as the input data signal. When pad circuit 200 is configured for data input processing, output buffer 202 is essentially turned off and the pad is placed at a relatively high impedance (i.e., tri-state mode). This allows the input data signals presented at the pad, from external sources, to be transmitted by input buffer 204 to the logic array.

When multiple pads, either from the same chip or different chips, are tied to the same wire, it may be desirable to implement a "wired AND" functionality, whereby, if any pad drives a low signal (logic 0), the wire is pulled low (logic 0). This can be achieved by using a pullup on the wire and configuring each pad circuit in open-drain mode, such that, when the data signal is high (logic 1), the corresponding output is in high-impedance data-input mode, letting the wire be pulled up by the pullup, and, when the data signal is low (logic 0), the corresponding output is low.

As described earlier, a tri-state signal of logic 1 will cause the pad circuit to be configured in the high-impedance data-input mode. One way to configure the pad circuit in the open-drain drive mode is to apply the output data signal to the tri-state port of the output buffer. For conventional FPGAs, general routing resources of the FPGA (e.g., programmable routers external to the I/O cells that connect the I/O cells to the logic array) can be used to tie the output data signal to the output buffer's tri-state port, but not without costly consequences.

First of all, using FPGA general routing resources leads to unpredictable and slower performance, in that there could be differences between (1) the time that the output data signal arrives at the data-in port of the output buffer and (2) the time that that same output data signal arrives at the tri-state port of the output buffer. Such differences can lead to delays in the switching of the pad circuit into or out of the high-impedance state that can unacceptably slow down the operations of the system of which the FPGA is a part. Moreover, the general routing resources of an FPGA are finite, and having to use some of those finite resources for the overhead of achieving open-drain drive mode can be inefficient, especially where those resources might otherwise be used to increase the overall programming flexibility of the FPGA.

It is a goal of the present invention to address these limitations of the prior art. Further aspects and advantages of this invention will become apparent from the detailed description which follows.

SUMMARY OF THE INVENTION

The present invention is directed to a field-programmable gate array comprising a plurality of programmable cells, wherein a first subset of the plurality of programmable cells are logic cells, and a second subset of the plurality of programmable cells are input/output (I/O) cells. At least one of the plurality of programmable cells comprises one or more cell output nodes and an output node circuit for each of the cell output nodes. At least one output node circuit comprises: (a) an output buffer having a data-in port, a tri-state port, and a data-out port, and adapted to receive an output data signal at the data-in port and a tri-state signal at the tri-state port and to generate an output signal at the data-out port for the cell output node; and (b) a mux having two mux input ports and a mux output port connected to the tri-state port of the output buffer and adapted to receive the output data signal and the tri-state signal at the two mux input ports and to generate at the mux output port a signal to the tri-state port of the output buffer to provide a dedicated path for the output data signal to be transmitted to the tri-state port to configure the output node circuit in an open-drain drive mode.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention is directed, for example, to a new design for the pad circuitry used in the I/O cells of an FPGA. In one embodiment, a programmable multiplexer (mux) is added to the pad circuit to provide a predictable and fast path for applying an output data signal to the tri-state port of the pad circuit's output buffer. In this way, the pad circuit can be configured in the open-drain drive mode in a fast, efficient, and reliable manner without expending some of the finite general routing resources of the FPGA.

Figure 1:
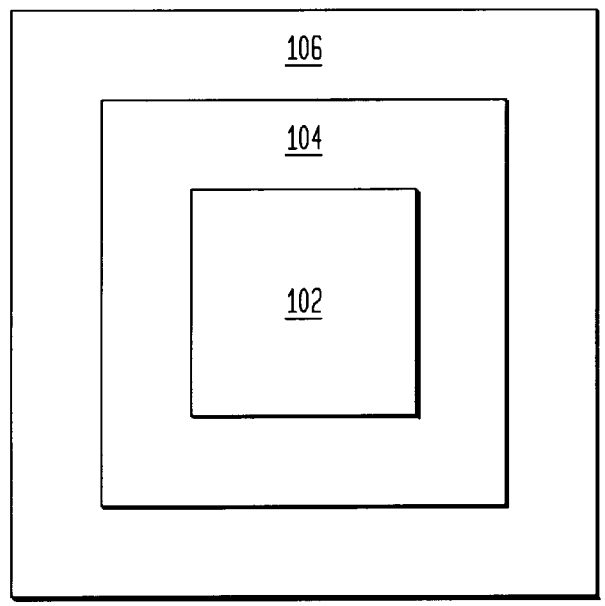
FIG. 1 shows a schematic diagram of a typical FPGA.
Figure 2:
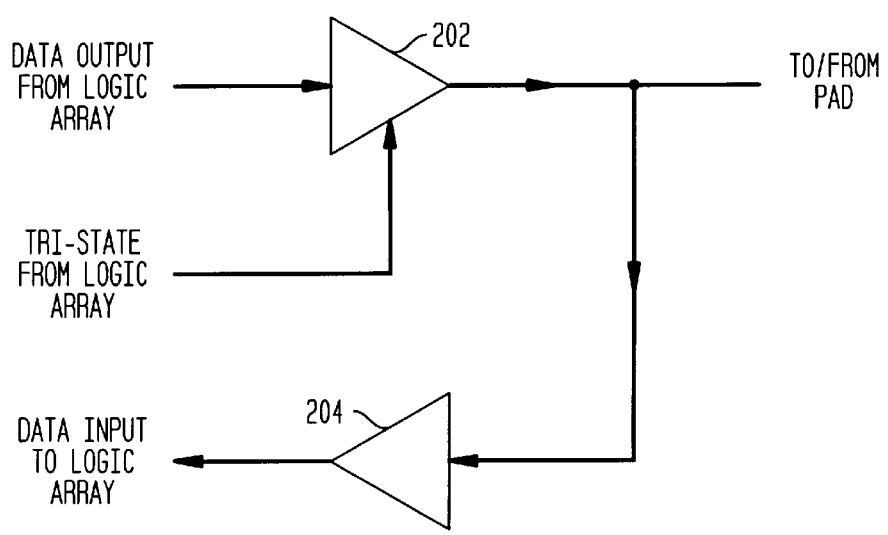
FIG. 2 shows a simplified block diagram of a typical pad circuit for an I/O cell of the FPGA of FIG. 1.
Figure 3:
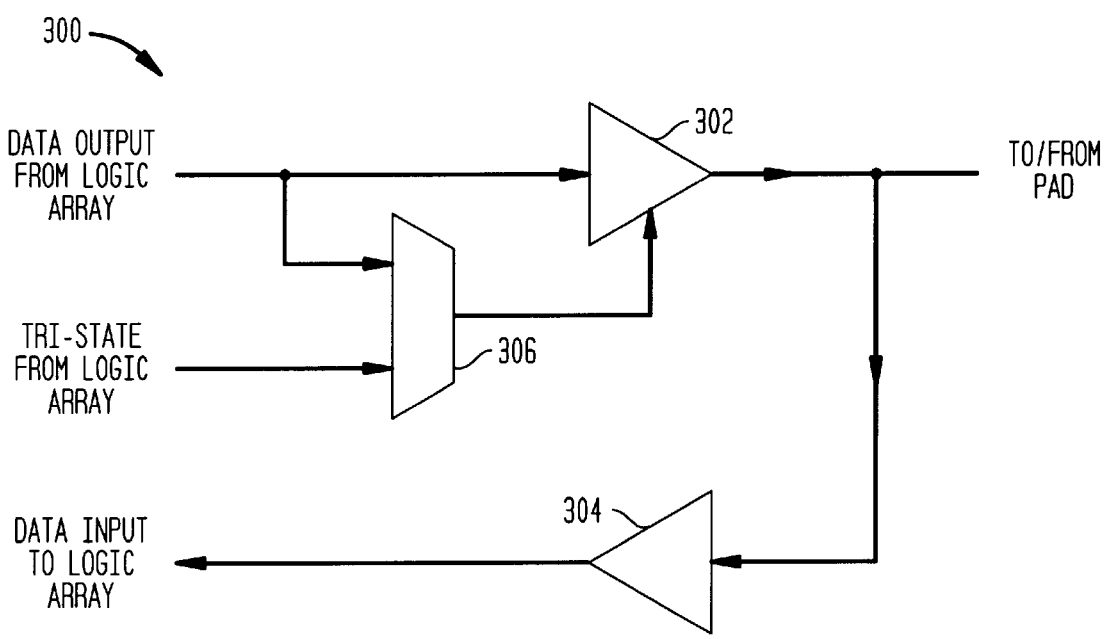
FIG. 3 shows a simplified block diagram of a pad circuit for an FPGA I/O cell, according to a preferred embodiment of the present invention.

FIG. 3 shows a simplified block diagram of a pad circuit 300 for an FPGA I/O cell, according to a preferred embodiment of the present invention. Pad circuit 300 comprises output buffer 302 and input buffer 304, which function analogously to the output and input buffers of conventional pad circuits, such as pad circuit 200 of FIG. 2. In addition, pad circuit 300 comprises mux 306, which has two input ports and one output port. The two mux input ports are configured to receive, respectively, the tri-state signal and the output data signal (which also goes to the data-in port of output buffer 302). The mux output port is connected to the tri-state port of output buffer 302.

In one embodiment, mux 306 is programmable through software (e.g., controlled by a signal received from SRAM memory) to operate in two different modes. In a first mux operating mode, mux 306 ignores the output data signal and always passes the tri-state signal to the tri-state port of output buffer 302. In a second mux operating mode, mux 306 ignores the tri-state signal and always passes the output data signal to the tri-state port of output buffer 302. In this implementation, if the output data signal is low, then the signal presented at the pad is low. If the output data signal is high, then the signal presented at the pad is the high-impedance-mode signal. As such, this second mux operating mode configures the pad circuit in open-drain drive mode.

The present invention provides a fast, predictable way to configure the pad circuitry of FPGA I/O cells for open-drain drive mode operations without using any of the slower, unpredictable FPGA general routing resources. As such, those resources are available to support other FPGA functionality, resulting in greater programming flexibility for the FPGA.

In the embodiment of FIG. 3, the present invention is implemented as a pad circuit of an FPGA I/O cell having an output buffer, an input buffer, and a programmable mux. The present invention can also be implemented in alternative embodiments. For example, the mux can be non-programmable (i.e., hardwired or factory programmed to permanently enable open-drain drive mode operations). It should be noted that, even when the mux is programmable, it is still possible to route the output data signal to the output buffer's tri-state port via the FPGA's programmable routing resources.

The present invention may also be implemented in "output only" circuitry that does not have an input buffer. Although not shown in FIG. 3, the present invention can be implemented in circuitry in which the output data signal is presented to the output buffer from either internal or external data flip-flops or even from circuitry other than data flip-flops. Although FIG. 3 shows a pad circuit of an FPGA I/O cell, the present invention can also be implemented as the output node circuit of an FPGA logic cell that presents its output data signal at a node internal to the FPGA.

A typical FPGA has both programmable logic cells and programmable I/O cells. Each of these programmable cells may be connected to one or more output nodes (i.e., internal nodes for the logic cells and pads for the I/O cells), where each output node has a corresponding output node circuit. In general, the present invention is directed to an FPGA in which at least one output node circuit of at least one programmable cell has a mux that enables open-drain drive mode operations. In one embodiment of an FPGA of the present invention, for example, all of the pad circuits of all of the I/O cells have such a mux. In another embodiment, only a subset of the I/O cells have such pad circuitry.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A field-programmable gate array comprising a plurality of programmable cells, wherein:
   a first subset of the plurality of programmable cells are logic cells;
   a second subset of the plurality of programmable cells are input/output (I/O) cells;
   at least one of the plurality of programmable cells comprises one or more cell output nodes and an output node circuit for each of the cell output nodes;
   at least one output node circuit comprises:
   (a) an internal output data node;
   (b) an output buffer having (1) a data-in port connected directly to the output data node, (2) a tri-state port, and (3) a data-out port, and adapted to receive (i) an output data signal at the data-in port directly from the output data node and (ii) a tri-state signal at the tri-state port and to generate an output signal at the data-out port for the cell output node; and
   (c) a mux having two mux input ports, one of which is connected directly to the output data node, and a mux output port connected directly to the tri-state port of the output buffer and adapted to receive (i) the output data signal directly from the output data node and (ii) the tri-state signal at the two mux input ports and to generate at the mux output port a signal to be transmitted directly to the tri-state port of the output buffer to provide a dedicated path for the output data signal to be transmitted from the output data node to the tri-state port without passing through any other intervening logic in order to configure the output node circuit in an open-drain drive mode.

2. The invention of claim 1, wherein the mux is programmable to selectively enable and disable the open-drain drive mode.

3. The invention of claim 1, wherein the at least one of the plurality of programmable cells is an I/O cell that drives an external wire.

4. The invention of claim 3, wherein the mux is programmable to selectively enable and disable the open-drain drive mode.

5. The invention of claim 1, wherein the at least one of the plurality of programmable cells is a logic cell that drives an internal wire.

6. The invention of claim 5, wherein the mux is programmable to selectively enable and disable the open-drain drive mode.

7. The invention of claim 1, wherein the output node circuit further comprises an input buffer connected to the cell output node and adapted to receive an input data signal.

8. The invention of claim 7, wherein the mux is programmable to selectively enable and disable the open-drain drive mode.

9. The invention of claim 7, wherein the at least one of the plurality of programmable cells is an I/O cell that drives an external wire.

10. The invention of claim 9, wherein the mux is programmable to selectively enable and disable the open-drain drive mode.

11. The invention of claim 7, wherein the at least one of the plurality of programmable cells is a logic cell that drives an internal wire.

12. The invention of claim 11, wherein the mux is programmable to selectively enable and disable the open-drain drive mode.

* * * * *